United States Patent
Kim et al.

(10) Patent No.: US 10,181,585 B2
(45) Date of Patent: Jan. 15, 2019

(54) DISPLAY DEVICE INCLUDING A REFLECTION PREVENTING LAYER

(71) Applicant: SAMSUNG DISPLAY CO., LTD., Yongin-si, Gyeonggi-Do (KR)

(72) Inventors: Doo Hwan Kim, Yongin-si (KR); Sang Hwan Cho, Yongin-si (KR); Chung Sock Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 9 days.

(21) Appl. No.: 15/633,939

(22) Filed: Jun. 27, 2017

(65) Prior Publication Data
US 2017/0373282 A1    Dec. 28, 2017

(30) Foreign Application Priority Data
Jun. 28, 2016    (KR) .................. 10-2016-0080941

(51) Int. Cl.
*H01L 51/52* (2006.01)
*H01L 27/32* (2006.01)
*H01L 27/12* (2006.01)

(52) U.S. Cl.
CPC ...... *H01L 51/5281* (2013.01); *H01L 27/3262* (2013.01); *H01L 27/3265* (2013.01); *H01L 51/5218* (2013.01); *H01L 51/5234* (2013.01); *H01L 51/5284* (2013.01); *H01L 27/1255* (2013.01); *H01L 2251/558* (2013.01)

(58) Field of Classification Search
CPC ............. H01L 27/3262; H01L 27/3265; H01L 27/326; H01L 51/5281; H01L 51/5284; H01L 51/5218; H01L 51/5234; H01L 51/5225
See application file for complete search history.

(56) References Cited

U.S. PATENT DOCUMENTS

| | | | |
|---|---|---|---|
| 8,536,781 B2 * | 9/2013 | Lee ..................... | H01L 51/5281 313/504 |
| 2005/0264184 A1 * | 12/2005 | Park .................... | H01L 27/3267 313/504 |
| 2015/0293560 A1 | 10/2015 | Choi et al. | |
| 2016/0359143 A1 * | 12/2016 | Osawa ................ | H01L 51/5278 |
| 2016/0365405 A1 * | 12/2016 | Chen .................... | H01L 27/3276 |

FOREIGN PATENT DOCUMENTS

| KR | 10-1076262 | 10/2011 |
|---|---|---|
| KR | 10-2013-0043929 | 5/2013 |
| KR | 10-2015-0118636 | 10/2015 |

* cited by examiner

*Primary Examiner* — Michael M Trinh
(74) *Attorney, Agent, or Firm* — F. Chau & Associates, LLC (57) ABSTRACT

A display device includes a substrate, a first electrode, an organic light-emitting layer, a second electrode, a phase matching layer, and at least one light-absorbing layer. The substrate includes a plurality of pixel regions and a non-pixel region. The non-pixel region is arranged between adjacent pixel regions. The first electrode is arranged in each pixel region. The organic light-emitting layer is arranged on the first electrode. The second electrode is arranged on the organic light-emitting layer. The phase matching layer is arranged on the second electrode. The at least one light-absorbing layer is arranged on the phase matching layer. A thickness of the second electrode in the non-pixel region is different than a thickness of the second electrode in the pixel regions.

20 Claims, 6 Drawing Sheets

DISPLAY DEVICE INCLUDING A REFLECTION PREVENTING LAYER

CROSS-REFERENCE TO RELATED APPLICATION

This application claims priority under 35 U.S.C. § 119 to Korean Patent Application No. 10-2016-0080941, filed on Jun. 28, 2016 in the Korean Intellectual Property Office, the disclosure of which is incorporated by reference herein in its entirety.

TECHNICAL FIELD

Exemplary embodiments of the present invention relate to a display device, and more particularly to a display device including a reflection preventing layer.

DISCUSSION OF RELATED ART

An organic light-emitting display device is a self-emission type display device. The organic light-emitting display device may have a relatively large viewing angle, a relatively high contrast, and a relatively high response speed as compared to a light-receiving type display device, such as a liquid crystal display (LCD).

The organic light-emitting display device may include a plurality of metal patterns or a plurality of metal layers. The metal patterns and the metal layers may reflect external light. To reduce or prevent the external light from being reflected, the device may include a polarizing plate. The polarizing plate may include a polarizer and a phase delaying plate. However, a transmittance of light emitted from an inside of the device may deteriorate.

SUMMARY

One or more exemplary embodiments of the present invention relate to a display device with an increased picture quality.

One or more exemplary embodiments of the present invention provide a display device. The display device includes a substrate, a first electrode, an organic light-emitting layer, a second electrode, a phase matching layer, and at least one light-absorbing layer. The substrate includes a plurality of pixel regions and a non-pixel region. The non-pixel region is arranged between adjacent pixel regions. The first electrode is arranged in each pixel region. The organic light-emitting layer is arranged on the first electrode. The second electrode is arranged on the organic light-emitting layer. The phase matching layer is arranged on the second electrode. The at least one light-absorbing layer is arranged on the phase matching layer. A thickness of the second electrode in the non-pixel region is different from a thickness of the second electrode in the pixel regions.

The second electrode may be a semi-transmissive reflecting layer in the pixel regions. The second electrode may be a reflecting layer in the non-pixel region.

A thickness of the second electrode in the non-pixel region may be larger than a thickness of the second electrode in the pixel regions.

The thickness of the second electrode in the non-pixel region may be larger than the thickness of the second electrode in the pixel regions by no less than 50 Å.

The thickness of the second electrode in the non-pixel region is about 200 Å to about 500 Å.

The thickness of the second electrode in the non-pixel region is about 4/3 to about 10/3 of the thickness of the second electrode in the pixel regions.

The light-absorbing layer in a visible ray region may include a material in which multiplication of a refractive index and an extinction coefficient of the material is no less than 0.5.

The light-absorbing layer in the visible ray region may include a material in which multiplication of a refractive index and an extinction coefficient of the material may be about 2 to about 4.

The light-absorbing layer may include Cr, Mo, Ti, Co, Ni, Ti, Al, W, Mn, CrNx, TiNx, TiAlNx, MoOx, CuOx, or a combination thereof.

The phase matching layer in the visible ray region may include a material with a refractive index of no less than 1 and an extinction coefficient of no more than 5.

The phase matching layer may include SiNx, SiOx, SiCN, LiF, $MgF_2$, $CaF_2$, or any combination thereof.

The display device may further include a thin film encapsulation layer. The thin film encapsulation layer may be arranged on the light-absorbing layer.

The display device may further include a light-blocking pattern. The light-blocking pattern may be arranged on the thin film encapsulation layer in the non-pixel region.

The display device further includes a touch screen. The touch screen may be arranged between the thin film encapsulation layer and the light-blocking pattern.

BRIEF DESCRIPTION OF THE DRAWINGS

These and/or other aspects of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described below in more detail with reference to the accompanying drawings. It is to be understood that the present invention may be embodied in many different forms and should not be construed as being limited to the embodiments of the present invention set forth herein.

Like reference numerals may refer to like elements throughout the specification and drawings.

Sizes of elements in the drawings may be exaggerated for clarity of description.

It will be understood that when an element is referred to as being "on" another element, the element can be directly on the other element or intervening elements may be present.

Figure 1:
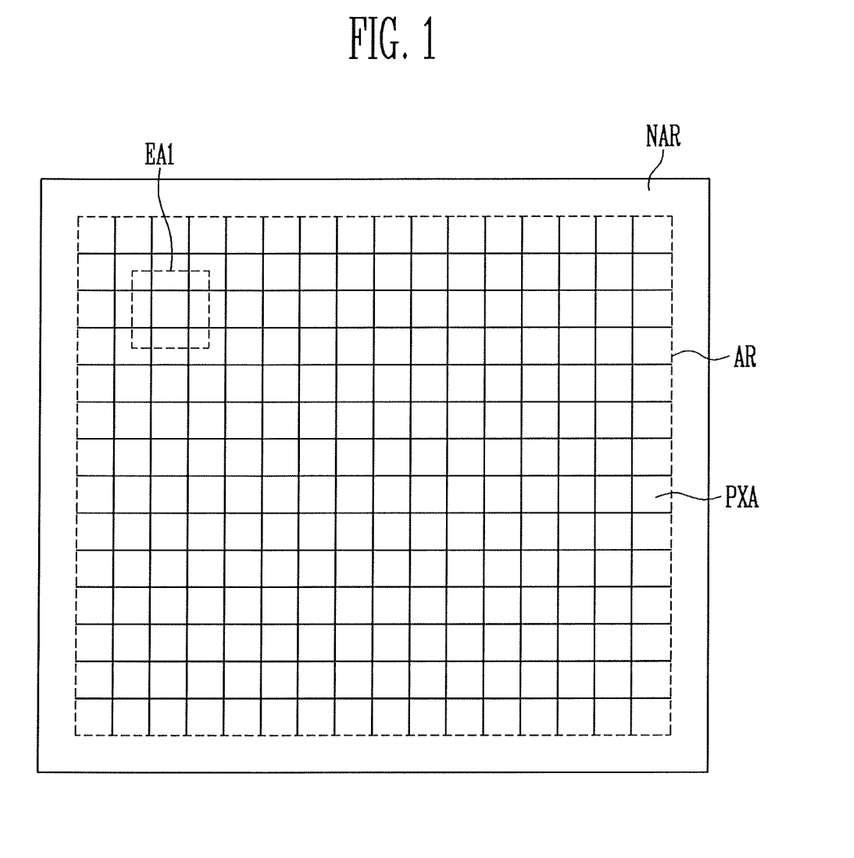
FIG. 1 is a plan view illustrating a display device according to an exemplary embodiment of the present invention.
Figure 2:
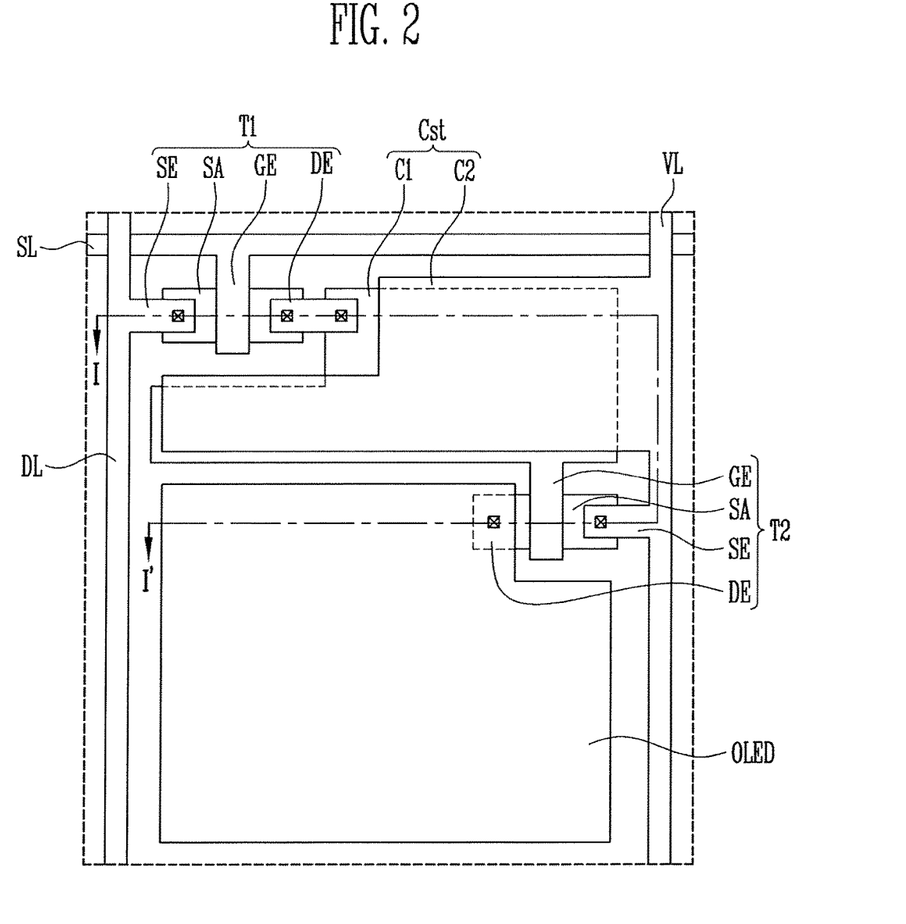
FIG. 2 is an enlarged view illustrating a region EA1 of FIG. 1 according to an exemplary embodiment of the present invention.
Figure 3:
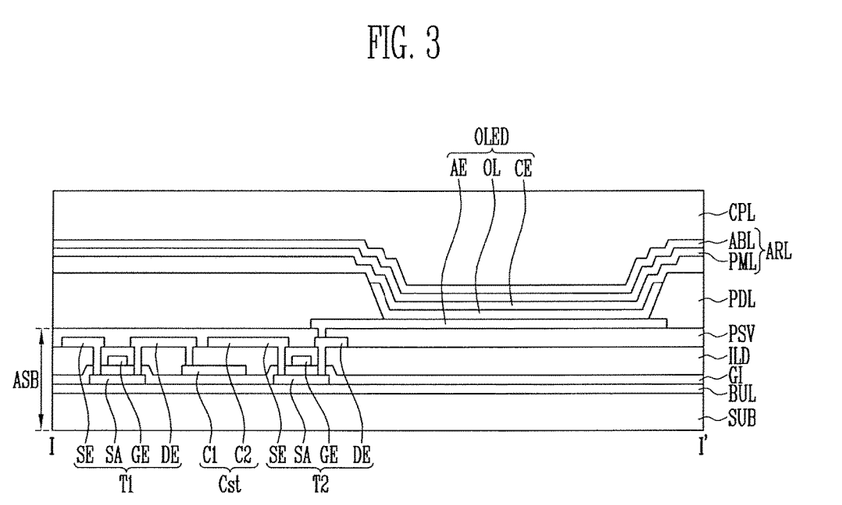
FIG. 3 is a cross-sectional view taken along a line I-I' of FIG. 2 according to an exemplary embodiment of the present invention.

FIG. 1 is a plan view illustrating a display device according to an exemplary embodiment of the present invention. FIG. 2 is an enlarged view of a region EA1 of FIG. 1 according to an exemplary embodiment of the present invention. FIG. 3 is a cross-sectional view taken along a line I-I' of FIG. 2 according to an exemplary embodiment of the present invention.

Referring to FIGS. 1 to 3, a display device may include an active region AR and a non-active region NAR. The active region AR may include a plurality of pixel regions PXA. The non-active region NAR may be adjacent to the active region AR. For example, the non-active region NAR may surround the active region AR.

The display device may include an array substrate ASB, a plurality of organic light emitting diodes (OLED), a reflection preventing layer ARL, and an encapsulation member CPL. The OLEDs may be respectively arranged in the pixel regions PXA. The OLEDs may be formed on the array substrate ASB. The encapsulation member CPL may be arranged on the reflection preventing layer ARL.

The array substrate ASB may include a base substrate SUB, a first thin film transistor (TFT) T1, a second TFT T2, and a capacitor Cst. The first TFT T1, the second TFT T2, and the capacitor Cst may be respectively arranged in the pixel regions PXA. The first TFT T1, the second TFT T2, and the capacitor Cst may each be formed on the base substrate SUB.

The base substrate SUB may include a transparent insulating material. The base substrate SUB may transmit light. The base substrate SUB may be a relatively rigid substrate. For example, the base substrate SUB may include glass, quartz, a glass ceramic, or a crystalline glass.

The base substrate SUB may be a relatively flexible substrate. For example, the base substrate SUB may be a film base substrate or a plastic base substrate. The base substrate SUB may include a relatively high molecular organic material. For example, the base substrate SUB may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), or cellulose acetate propionate (CAP). The base substrate SUB may also include fiber glass reinforced plastic (FRP).

The material included in the base substrate SUB may have a resistance against a relatively high processing temperature, for example a relatively high heat resistance, during a manufacturing process of the display device.

The first TFT T1 or the second TFT T2 may be a switching device. For example, the first TFT T1 may be a switching device. Therefore, the first TFT T1 may be connected to each of a gate line SL and a data line DL.

The other of the first TFT T1 and the second TFT T2 may be a driving device. For example, the second TFT T2 may be a driving device. Therefore, the second TFT T2 may be connected to each of the capacitor Cst and a power supply line VL.

Each of the first TFT T1 and the second TFT T2 may include a semiconductor layer SA, a gate electrode GE, a source electrode SE, and a drain electrode DE. The gate electrode GE may be insulated from the semiconductor layer SA. The drain electrode DE may be connected to the semiconductor layer SA.

The semiconductor layer SA may be arranged on the base substrate SUB. The semiconductor layer SA may include amorphous silicon (a-Si), polycrystalline silicon (p-Si), an oxide semiconductor, or an organic semiconductor. The oxide semiconductor may include zinc (Zn), indium (In), gallium (Ga), tin (Sn), or a mixture thereof. For example, the oxide semiconductor may include indium-gallium-zinc oxide (IGZO).

In the semiconductor layer SA, a source region and a drain region may be respectively connected to the source electrode SE and the drain electrode DE. The source region and the drain region may each be doped with impurities. Alternatively, impurities may be injected into each of the source region and the drain region. The semiconductor layer SA may also include a channel region. The channel region may be disposed between the source region and the drain region.

When the semiconductor layer SA includes the oxide semiconductor, light-blocking layers may be arranged on and below the semiconductor layer SA. The light-blocking layers may be configured to block light received by the semiconductor layer SA.

A buffer layer BUL may be arranged between the substrate SUB and the semiconductor layer SA. The buffer layer BUL may include a silicon oxide (SiOx) and/or a silicon nitride (SiNx). The buffer layer BUL may have a multi-layered structure. For example, the buffer layer BUL may include a first layer including a silicon oxide and a second layer arranged on the first layer and including a silicon nitride. The buffer layer BUL may also include a silicon oxynitride (SiON). The buffer layer BUL may reduce or prevent impurities from diffusing and permeating from the base substrate SUB into the semiconductor layer SA of each of the first TFT T1 and the second TFT T2. The buffer layer BUL may also reduce or prevent electrical characteristics of the first TFT T1 and the second TFT T2 from deteriorating.

The buffer layer BUL may prevent moisture and oxygen from permeating from the outside into the OLED OLED. The buffer layer BUL may planarize a surface of the base substrate SUB.

A gate insulating layer GI may be arranged on each of the base substrate SUB and the semiconductor layer SA. The gate insulating layer GI may cover the semiconductor layer SA. The gate insulating layer GI may insulate the semiconductor layer SA and the gate electrode GE from each other. The gate insulating layer GI may include a silicon oxide (SiOx) and/or a silicon nitride (SiNx).

Each of the gate line SL, the gate electrode GE, and a first capacitor electrode C1 of the capacitor Cst may be arranged on the gate insulating layer GI. The gate line SL may extend in one direction.

An interlayer dielectric layer ILD may be arranged on each of the gate insulating layer GI, the gate line SL, the gate electrode GE, and the first capacitor electrode C1. The interlayer dielectric layer ILD may cover the gate electrode GE. The interlayer dielectric layer ILD may include a silicon oxide (SiOx) and/or a silicon nitride (SiNx). A part of the interlayer dielectric layer ILD may be removed so that the source region and the drain region of the semiconductor layer SA are exposed.

Each of the data line DL, the power supply line VL, a second capacitor electrode C2 of the capacitor Cst, the source electrode SE, and the drain electrode DE may be arranged on the interlayer dielectric layer ILD. The data line DL may be insulated from the gate line SL. The data line DL may intersect the gate line SL. The power supply line VL may be disposed to be separated from the data line DL.

The source electrode SE and the drain electrode DE may each be insulated from the gate electrode GE, for example, by the interlayer dielectric layer ILD. The source electrode SE and the drain electrode DE may be respectively connected to the source region and the drain region.

According to an exemplary embodiment of the present invention, the second TFT T2 and the first TFT T1 may each be top gate-type TFTs. However, exemplary embodiments of the present invention are not limited thereto. For example, at least one of the second TFT T2 and the first TFT T1 may be a bottom gate-type TFT.

The capacitor Cst may include the first capacitor electrode C1 and the second capacitor electrode C2. The first capacitor electrode C1 may include substantially the same material as each of the gate line SL and the gate electrode GE. The first capacitor electrode C1 may be arranged in the same layer as each of the gate line SL and the gate electrode GE.

The second capacitor electrode c2 may include substantially the same material as each of the data line DL, the power supply line VL, the source electrode SE, and the drain electrode DE. The second capacitor electrode c2 may be arranged in the same layer as each of the data line DL, the power supply line VL, the source electrode SE, and the drain electrode DE.

A protective layer PSV may be arranged on the base substrate SUB on which the first TFT T1, the second TFT T2, and the capacitor Cst are arranged. The protective layer PSV may cover each of the first TFT T1, the second TFT T2, and the capacitor Cst. The protective layer PSV may expose a part of the drain electrode DE of the second TFT T2.

The protective layer PSV may include at least one layer. For example, the protective layer PSV may include at least one of an inorganic protective layer and an organic protective layer. The inorganic protective layer may cover each of the first TFT T1, the second TFT T2, and the capacitor Cst. The organic protective layer may be arranged on the inorganic protective layer.

The inorganic protective layer may include at least one of a silicon oxide (SiOx) and/or a silicon nitride (SiNx). The organic protective layer may also include an organic insulating material. The organic insulating material may transmit light. For example, the organic protective layer may include a polyacrylates resin, an epoxy resin, a phenolic resin, a polyamides resin, a polyimides resin, an unsaturated polyesters resin, a polyphenylene ethers resin, a polyphenylene sulfides resin, a benzocyclobutenes resin, or any combination thereof.

The OLED OLED connected to the drain electrode DE of the second TFT T2 may be arranged on the protective layer PSV.

The OLED OLED may include a first electrode AE, an organic layer OL, and a second electrode CE. The first electrode AE may be connected to the drain electrode DE of the second TFT T2. The organic layer OL may be arranged on the first electrode AE. The second electrode CE may be arranged on the organic layer OL.

One of the first electrode AE and the second electrode CE may be an anode electrode. The other of the first electrode AE and the second electrode CE may be a cathode electrode. For example, the first electrode AE may be an anode electrode. The second electrode CE may be a cathode electrode.

At least one of the first electrode AE and the second electrode CE may be a transmissive electrode. For example, when the OLED OLED is a rear emission-type OLED, the first electrode AE may be a transmissive electrode and the second electrode CE may be a reflective electrode. When the OLED OLED is a front emission-type OLED, the first electrode AE may be a reflective electrode and the second electrode CE may be a transmissive electrode. When the OLED OLED is a double-side emission type OLED, the first electrode AE and the second electrode CE may each be transmissive electrodes. According to an exemplary embodiment of the present invention, the first electrode AE may be an anode electrode and the OLED OLED may be the front-emission type OLED.

The first electrode AE may be arranged on the protective layer PSV. The first electrode AE may include a reflecting layer and a transparent conductive layer. The reflecting layer may reflect light. The transparent conductive layer may be arranged on or below the reflecting layer. At least one of the reflecting layer and the transparent conductive layer may be connected to the drain electrode DE of the second TFT T2.

The reflecting layer may include a material that may reflect light. For example, the reflecting layer may include aluminum (Al), silver (Ag), chrome (Cr), molybdenum (Mo), platinum (Pt), nickel (Ni), an alloy thereof, or a combination thereof.

The transparent conductive layer may include a transparent conductive oxide. For example, the transparent conductive layer may include a transparent conductive oxide such as indium tin oxide (ITO), indium zinc oxide (IZO), aluminum zinc oxide (AZO), gallium doped zinc oxide (GZO), zinc tin oxide (ZTO), gallium tin oxide (GTO), fluorine doped tin oxide (FTO), or any combination thereof.

A pixel defining layer PDL may be arranged on each of the first electrode AE and the protective layer PSV. The pixel defining layer PDL may expose a part of the first electrode AE. For example, the pixel defining layer PDL may cover an edge of the first electrode AE and the protective layer PSV.

The pixel defining layer PDL may include an organic insulating material. For example, the pixel defining layer PDL may include polystyrene, polymethylmethacrylate (PMMA), polyacrylonitrile (PAN), polyamide (PA), polyimide (PI), polyarylether (PAE), a heterocyclic polymer, parylene, an epoxy resin, benzocyclobutene (BCB), a siloxane based resin, or a silane based resin.

The organic layer OL may have a multi-layered thin film structure. The multi-layered thin film structure may include an emitting layer (EML). For example, the organic layer OL may include a hole injection layer HIL, a hole transport layer HTL, the emitting layer EML, an electron transport layer ETL, and an electron injection layer EIL. The hole injection layer HIL may inject holes. The hole transport layer HTL may have a relatively high transportability of holes. The hole transport layer HTL may prevent electrons not combined in the emitting layer from moving and, thus increasing a recombination probability of holes and electrons. The emitting layer EML may emit light, for example, by recombination of the injected electrons and holes. The electron transport layer EIL may relatively easily transport electrons to the emitting layer. The electron injection layer EIL may inject electrons. The hole injection layer HIL, the hole transport layer HTL, the electron transport layer ETL, and the electron injection layer EIL may be common layers. The common layers may extend to adjacent pixel regions PXA. The common layers may also be shared by the pixel regions PXA. A color of light generated by the emitting layer may be red, green, blue, or white. However, exemplary embodiments of the present invention are not limited thereto. For example, a color of light generated by the emitting layer of the organic layer OL may be magenta, cyan, or yellow.

The second electrode CE may be arranged on the organic layer OL. The second electrode CE may be a semi-transmissive reflecting layer. For example, the second electrode CE may be a thin metal layer. The thin metal layer may have a thickness in which light may be transmitted through the thin metal layer. The second electrode CE may transmit a part of the light generated by the organic layer OL. The second electrode CE may reflect the remaining light generated by the organic layer OL. The light reflected from the second electrode CE may be reflected from the reflecting layer of the first electrode AE and may pass through the second electrode CE, for example, due to constructive interference.

The second electrode CE may include a material with a lower work function than a work function of the transparent conductive layer of the first electrode AE. For example, the second electrode CE may include molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), calcium (Ca), lithium (Li), an alloy thereof, or any combination thereof.

A reflection preventing layer ARL may be arranged on the second electrode CE. The reflection preventing layer ARL may include at least one phase matching layer PML and a light-absorbing layer ABL. The at least one phase matching layer PML may be arranged on the second electrode CE. The light-absorbing layer ABL may be arranged on the phase matching layer PML.

The encapsulation member CPL may be arranged on the reflection preventing layer ARL. The encapsulation member CPL may isolate the OLED OLED from an external environment. For example, the encapsulation member CPL may reduce or prevent external moisture and oxygen from permeating into the OLED OLED.

The encapsulation member CPL may be a thin film encapsulation layer. The thin film encapsulation layer may include a plurality of inorganic layers and a plurality of organic layers. The inorganic layers and the organic layers may be arranged on the reflection preventing layer ARL. For example, in the encapsulation member CPL, the inorganic layer, and the organic layer may be alternately arranged on the reflection preventing layer ARL. An uppermost layer of the encapsulation member CPL may be an inorganic layer.

The inorganic layer may include a silicon oxide (SiOx), a silicon nitride (SiNx), a silicon oxynitride (SiON), an aluminum oxide ($Al_2O_3$), a titanium oxide ($TiO_2$), a zirconium oxide (ZrOx), a tin oxide (ZnO), or any combination thereof.

The same elements as those of FIGS. 1 to 3 may be denoted by the same reference numbers. Thus, a detailed description thereof may be omitted.

Figure 4:
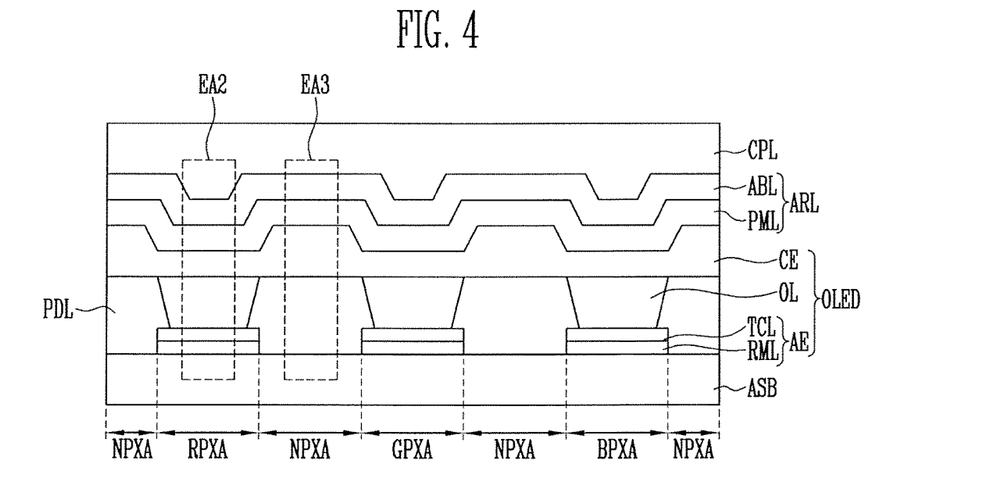
FIG. 4 is a schematic cross-sectional view illustrating a display device according to an exemplary embodiment of the present invention.
Figure 5:
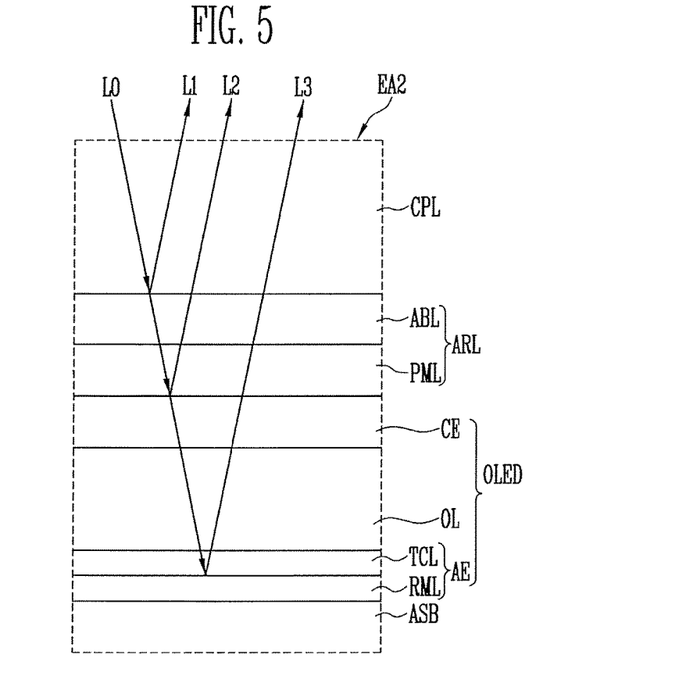
FIG. 5 is an enlarged view of a region EA2 of FIG. 4 according to an exemplary embodiment of the present invention.
Figure 6:
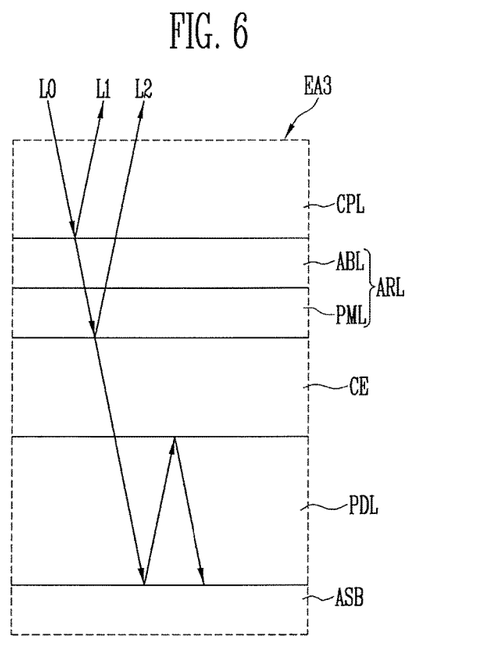
FIG. 6 is an enlarged view of a region EA3 of FIG. 4 according to an exemplary embodiment of the present invention.

FIG. 4 is a schematic cross-sectional view illustrating a display device according to an exemplary embodiment of the present invention. FIG. 5 is an enlarged view of a region EA2 of FIG. 4 according to an exemplary embodiment of the present invention. FIG. 6 is an enlarged view of a region EA3 of FIG. 4 according to an exemplary embodiment of the present invention.

Referring to FIGS. 4 to 6, a display device may include a plurality of pixel regions PXA. For example, the display device may include a red pixel region RPXA, a green pixel region GPXA, and a blue pixel region BPXA.

The display device may include an array substrate ASB, OLEDs OLED, a reflection preventing layer ARL, and an encapsulation member CPL. The OLEDs OLED may be respectively arranged in the pixel regions PXA formed on the array substrate ASB. The reflection preventing layer ARL may cover the OLEDs. The encapsulation member CPL may be arranged on the reflection preventing layer ARL.

The OLED OLED arranged in the red pixel region RPXA may emit red light. The OLED OLED arranged in the green pixel region GPXA may emit green light. The OLED OLED arranged in the blue pixel region BPXA may emit blue light.

Each of the OLEDs OLED may include a first electrode AE, an organic layer OL, and a second electrode CE. The first electrode AE may be arranged on the array substrate ASB. The organic layer OL may be arranged on the first electrode AE. The second electrode CE may be arranged on the organic layer OL.

The first electrode AE may include a reflecting layer RML and a transparent conductive layer TCL. The reflecting layer RML may reflect light. The transparent conductive layer TCL may be arranged on or below the reflecting layer. For example, the transparent conductive layer TCL may be arranged on the reflecting layer RML.

A pixel defining layer PDL may be arranged on each of the first electrode AE and the array substrate ASB. The pixel defining layer PDL may expose a part of the first electrode AE. For example, the pixel defining layer PDL may cover an edge of the first electrode AE and the array substrate ASB.

The organic layer OL may include an emitting layer. When an energy level of excitons generated by combining electrons and holes supplied from the first electrode AE and the second electrode CE changes from an excited state to a base state, light may be emitted. The emitted light may have a color corresponding to the changed energy level.

The organic layer OL of the red pixel region RPXA may emit red light. The organic layer OL of the green pixel region GPXA may emit green light. The organic layer OL of the blue pixel region BPXA may emit blue light.

Thus, a color of the light emitted from the organic layer OL may be red, green, or blue. However, exemplary embodiments of the present invention are not limited thereto. For example, the color of the light emitted from the organic layer may be magenta, cyan, yellow, or white.

A light reflecting characteristic of the second electrode CE in the pixel regions PXA and a light reflecting characteristic of the second electrode CE in the non-pixel region NPXA may be different from each other. For example, the second electrode CE of the pixel region PXA may be a semi-transmissive reflecting layer and the second electrode CE in the non-pixel region NPXA may be a reflecting layer.

The second electrode CE in the pixel regions PXA and the second electrode CE in the non-pixel region NPXA may have different thicknesses. A thickness of the second electrode CE in the non-pixel region NPXA may be larger than a thickness of the second electrode CE in the pixel regions PXA. For example, the thickness of the second electrode CE in the non-pixel region NPXA may be larger than the thickness of the second electrode CE in the pixel regions PXA by no less than about 50 Å.

The thickness of the second electrode CE in the non-pixel region NPXA may be about 4/3 to about 10/3 of the thickness of the second electrode CE in the pixel regions PXA. The second electrode CE in the pixel regions PXA may have a thickness in which light may be transmitted through the second electrode CE. For example, the second electrode CE in the pixel regions PXA may have a thickness of about 150 Å. Therefore, the thickness of the second electrode CE in the non-pixel region NPXA may be in a range from about 200 Å to about 500 Å.

The reflection preventing layer ARL may include at least one phase matching layer PML and at least one light-absorbing layer ABL. The at least one phase matching layer PML may be arranged on the second electrode CE. The at least one light-absorbing layer ABL may be arranged on the phase matching layer PML.

The phase matching layer PML may have constructive interference occur between light reflected from the second electrode CE and light reflected from the reflecting layer RML of the first electrode AE. For example, the light reflected from the second electrode CE and the light reflected from the reflecting layer RML of the first electrode AE may have a phase difference that satisfies a constructive interference condition, for example, due to the phase matching layer PML. Therefore, a thickness of the phase matching layer PML of the red pixel region RPXA, a thickness of the phase matching layer PML of the green pixel region GPXA, and a thickness of the phase matching layer PML of the blue pixel region BPXA may each be different from each other. For example, the thickness of the phase matching layer PML of the red pixel region RPXA may be the largest thickness. The thickness of the phase matching layer PML of the blue pixel region BPXA may be the smallest thickness.

The phase matching layer PML may be optically transparent. Optically transparent may refer to no less than about 50%, for example, no less than about 80% of visible rays are transmitted.

In a visible ray region, a refractivity of the phase matching layer PML may include a material with a refractive index of no less than 1 and an extinction coefficient of no more than 5. For example, the phase matching layer PM may include an aluminum oxide (AlOx), a silicon oxide (SiOx), a calcium fluoride (CaF), a magnesium fluoride (MgF2), a lithium fluoride (LiF), a silicon nitride (SiNx), a silicon carbonitride (SiCN), a silicon oxynitride (SiON), a tantalum oxide (TaxOy), a titanium oxide (TiOx), or any combination thereof.

The phase matching layer PML may include a transparent conductive oxide. For example, the phase matching layer PML may include an indium tin oxide (ITO) and/or an indium zinc oxide (IZO).

The phase matching layer PML may include a conductive organic material. For example, the phase matching layer PML may include polypyrrole, polythiophene, polyacetylene, PEDOT:PSS(poly(3,4-ethylenedioxythiophene) polystyrene sulfonate), polyaniline, or any combination thereof. When the phase matching layer PML includes a transparent conductive oxide or a conductive organic layer, an IR-drop phenomenon may be reduced or prevented from being generated by the second electrode CE.

The light-absorbing layer ABL may be a semi-transmissive reflecting layer. Constructive interference may occur between light reflected from the light-absorbing layer ABL and light reflected from the second electrode CE. Constructive interference may occur between light reflected from the light-absorbing layer ABL and light reflected from the reflecting layer RML.

The light-absorbing layer ABL may include a material in which multiplication of a refractive index and an extinction coefficient is no less than about 0.5, for example, in a range from about 2 to about 4 in the visible ray region. For example, the light-absorbing layer ABL may include Cr, Ti, Mo, Co, Ni, W, Al, Ag, Au, Cu, Fe, Mg, Pt, Mn, an alloy thereof, or any combination thereof. The light-absorbing layer ABL may include a chrome nitride (CrNx), a titanium nitride (TiNx), a titanium aluminum nitride (TiAlNx), a molybdenum oxide (MoOx), a copper oxide (CuOx), or any combination thereof.

Referring to FIG. 5, in the pixel region PXA, a part of external light L0 incident on the display device may be reflected from the light-absorbing layer ABL. The remaining light may pass through the light-absorbing layer ABL. A part of the light that passes through the light-absorbing layer ABL may be reflected from the second electrode CE. The remaining light may pass through the second electrode CE. The light that passes through the second electrode CE may be reflected from the reflecting layer RML.

In the pixel region PXA, first reflected light L1 reflected from the light-absorbing layer ABL, second reflected light L2 reflected from the second electrode CE, and third reflected light L3 reflected from the reflecting layer RML may each be extinguished, for example, by extinction interference. In the pixel region PXA, the reflection preventing layer ARL may reduce or prevent external light from being reflected.

The thickness of the second electrode CE in the non-pixel region NPXA of the display device may be larger than the thickness of the second electrode CE in the pixel regions PXA.

Referring to FIG. 6, in the non-pixel region NPXA, a part of the external light L0 incident on the display device may be reflected from the light-absorbing layer ABL. The remaining light may pass through the light-absorbing layer ABL and may be reflected from the second electrode CE.

In the non-pixel region NPXA, the second reflected light L2 reflected from the second electrode CE and the first reflected light L1 reflected from the light-absorbing layer ABL may each be extinguished, for example, by extinction interference. In the non-pixel region NPXA, the reflection preventing layer ARL may reduce or prevent external light from being reflected.

In the non-pixel region NPXA, a relatively small portion of the external light may pass through the second electrode CE. The light that passes through the second electrode CE may be reflected from a metal layer of the array substrate ASB, for example, a gate line, a data line, a power supply line, a first capacitor electrode, a second capacitor electrode, a source electrode, or a drain electrode. However, the light reflected from the array substrate ASB might not pass through the second electrode CE. Thus, the light reflected from the array substrate ASB may be reflected from the second electrode CE again. Therefore, the light that passes through the second electrode CE of the external light may be extinguished between the second electrode CE and the array substrate ASB.

The display device may reduce or prevent the external light from being reflected by using the reflection preventing layer ARL. Therefore, the display device may reduce or prevent picture quality from deteriorating due to the external light without an additional planarizing plate.

Figure 7:
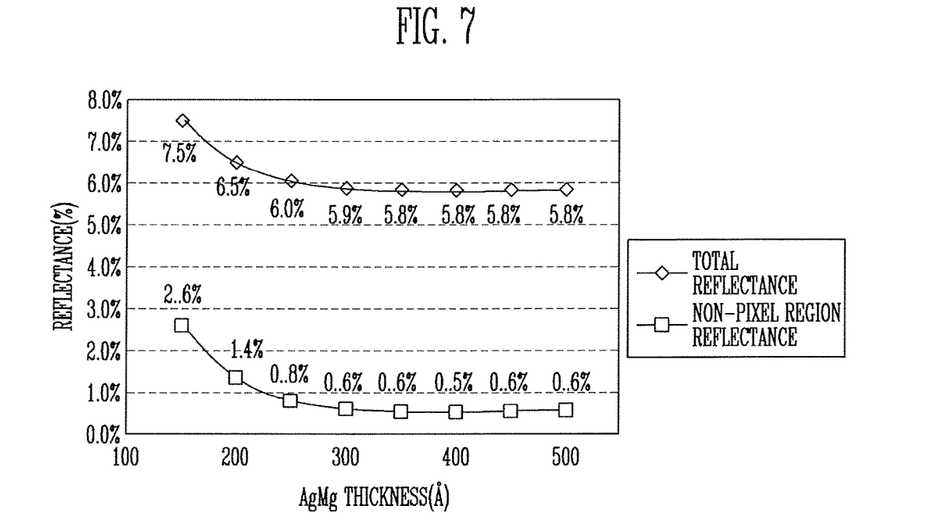
FIG. 7 is a graph illustrating reflectance of a display device measured in accordance with a thickness of a second electrode in a pixel region and a non-pixel region according to an exemplary embodiment of the present invention.

FIG. 7 is a graph in which reflectance of a display device is measured in accordance with a thickness of a second electrode in a pixel region and a non-pixel region according to an exemplary embodiment of the present invention. The display device measured in FIG. 7 and TABLE 1 includes a first electrode including a reflecting layer including Al and a transparent conductive layer including ITO, a second electrode including an organic layer and MgAg, and a reflection preventing layer arranged on the second electrode and including a phase matching layer and a light-absorbing layer. A distance between the reflecting layer and the second electrode is about 3,000 Å.

TABLE 1

Measurement of a Reflectance in accordance with Thicknesses of Second Electrode in Pixel Region and Non-Pixel Region

| Thickness of second electrode in pixel region (Å) | Thickness of second electrode in non-pixel region (Å) | Reflectance in non-pixel region (%) | Total reflectance (%) |
|---|---|---|---|
| 150 | 150 | 2.60 | 7.51 |
|  | 200 | 1.36 | 6.49 |
|  | 250 | 0.83 | 6.04 |
|  | 300 | 0.62 | 5.87 |
|  | 350 | 0.55 | 5.81 |
|  | 400 | 0.54 | 5.81 |
|  | 450 | 0.56 | 5.82 |
|  | 500 | 0.57 | 5.83 |

Referring to FIG. 7, as the thickness of the second electrode in the non-pixel region is larger than a thickness of the second electrode in the pixel region, a reflectance in the non-pixel region of the display device is reduced.

The reflectance in the non-pixel region of the display device is reduced may be as follows.

In the non-pixel region, most of the external light may be reflected from the second electrode and a relatively small portion of the external light may pass through the second electrode. The light reflected from the second electrode and the light reflected from the light-absorbing layer may be extinguished, for example, due to extinction interference. An amount of light that passes through the second electrode of the external light in the non-pixel region may be smaller than an amount of light that passes through the second electrode in the pixel region. Although the light that passes through the second electrode may be reflected from the array substrate, the light may pass through the second electrode and may be extinguished without being emitted to the outside.

The reflectance of the non-pixel region may be reduced as the thickness of the second electrode in the non-pixel region is larger than the thickness of the second electrode in the non-pixel region.

Figure 8:
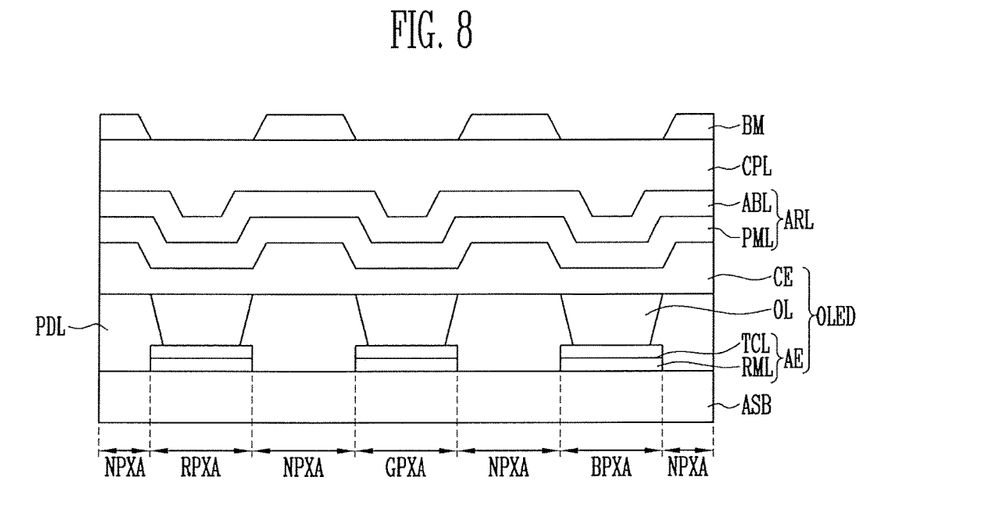
FIG. 8 is a plan view illustrating a display device according to an exemplary embodiment of the present invention.
Figure 9:
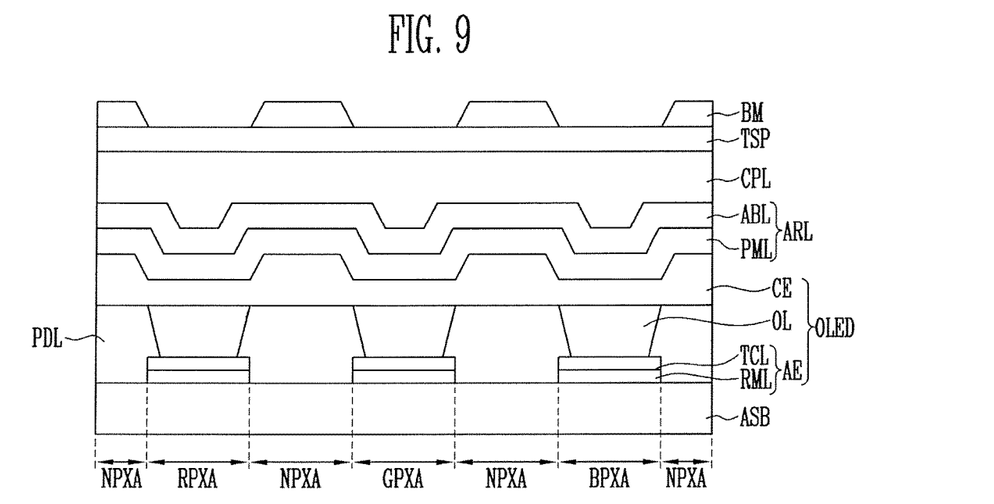
FIG. 9 is a plan view illustrating a display device according to an embodiment of the present invention.

In FIGS. 8 and 9, the same elements as FIGS. 1 to 6 may be referred to by the same reference numerals and a detailed description thereof may be omitted and differences between FIGS. 8 and 9 and FIGS. 1 to 6 will be mainly described.

FIG. 8 is a plan view illustrating a display device according to an exemplary embodiment of the present invention.

Referring to FIG. 8, a display device may include a plurality of pixel regions PXA. For example, the display device may include a red pixel region RPXA, a green pixel region GPXA, and a blue pixel region BPXA.

The display device may include an array substrate ASB, OLEDs OLED, a reflection preventing layer ARL, an encapsulation member CPL, and a light-blocking pattern BM. The OLEDs OLED may be respectively arranged in the pixel regions PXA formed on the array substrate ASB. The reflection preventing layer ARL may cover the OLEDs OLED. The encapsulation member CPL may be arranged on the reflection preventing layer ARL. The light-blocking pattern BM may be arranged on the encapsulation member CPL.

Each of the OLEDs OLED may include a first electrode AE, an organic layer OL, and a second electrode CE. The first electrode AE may be arranged on the array substrate ASB. The first electrode AE may include a reflecting layer RML and a transparent conductive layer TCL. The organic layer OL may be arranged on the first electrode AE. The second electrode CE may be arranged on the organic layer OL.

A light reflecting characteristic of the second electrode CE in the pixel regions PXA and a light reflecting characteristic of the second electrode CE in the non-pixel region NPXA may be different from each other. For example, the second electrode CE of the pixel region PXA may be a semi-transmissive reflecting layer and the second electrode CE in the non-pixel region NPXA may be a reflecting layer.

The second electrode CE in the pixel regions PXA and the second electrode CE in the non-pixel region NPXA may have different thicknesses. A thickness of the second electrode CE in the pixel regions PXA may be smaller than a thickness of the second electrode CE in the non-pixel region NPXA.

The reflection preventing layer ARL may include at least one phase matching layer PML and at least one light-absorbing layer ABL. The at least one phase matching layer PML may be arranged on the second electrode CE. The at least one light-absorbing layer ABL may be arranged on the phase matching layer PML.

The encapsulation member CPL may be arranged on the reflection preventing layer ARL. The encapsulation member CPL may isolate the OLED OLED from an external environment. For example, the encapsulation member CPL may reduce or prevent external moisture and oxygen permeating into the OLED OLED.

The light-blocking pattern BM may be arranged on the encapsulation member CPL, for example, in a region between adjacent pixel regions PXA. The light-blocking pattern BM may reduce or prevent colors of light components emitted from the adjacent pixel regions PXA from being mixed with each other. Therefore, the light-blocking pattern BM may increase a display characteristic of the display device.

The light-blocking pattern BM may include a photosensitive block resin composition or a metal with a relatively low light reflectance. Therefore, the light-blocking pattern BM may absorb external light. The light-blocking pattern BM may reduce or prevent external light from being reflected. The light-blocking pattern BM may increase a contrast of the display device.

FIG. 9 is a plan view illustrating a display device according to an exemplary embodiment of the present invention.

Referring to FIG. 9, a display device may include a plurality of pixel regions PXA. For example, the display device may include a red pixel region RPXA, a green pixel region GPXA, and a blue pixel region BPXA.

The display device may include an array substrate ASB, OLEDs OLED, a reflection preventing layer ARL, an encapsulation member CPL, a touch screen TSP, and a light-blocking pattern BM. The OLEDs OLED may be respectively arranged in the pixel regions PXA formed on the array substrate ASB. The reflection preventing layer ARL may cover the OLEDs OLED. The encapsulation member CPL may be arranged on the reflection preventing layer ARL. The touch screen TSP may be arranged on the encapsulation member CPL. The light-blocking pattern BM may be arranged on the touch screen TSP.

Each of the OLEDs OLED may include a first electrode AE, an organic layer OL, and a second electrode CE. The first electrode AE may be arranged on the array substrate ASB. The first electrode AE may include a reflecting layer RML and a transparent conductive layer TCL. The organic layer OL may be arranged on the first electrode AE.

A light reflecting characteristic of the second electrode CE in the pixel regions PXA and a light reflecting characteristic of the second electrode CE in the non-pixel region NPXA may be different from each other. For example, the second electrode CE of the pixel region PXA may be a semi-transmissive reflecting layer and the second electrode CE in the non-pixel region NPXA may be a reflecting layer.

The second electrode CE in the pixel regions PXA and the second electrode CE in the non-pixel region NPXA may have different thicknesses. A thickness of the second electrode CE in the pixel regions PXA may be smaller than a thickness of the second electrode CE in the non-pixel region NPXA.

The reflection preventing layer ARL may include at least one phase matching layer PML and at least one light-absorbing layer ABL. The at least one phase matching layer PML may be arranged on the second electrode CE. The at least one light-absorbing layer ABL may be arranged on the phase matching layer PML.

The encapsulation member CPL may be arranged on the reflection preventing layer ARL. The encapsulation member CPL may isolate the OLED OLED from an external environment. For example, the encapsulation member CPL may reduce or prevent external moisture and oxygen permeating into the OLED OLED.

The touch screen TSP may be an information input device. The touch screen TSP may be arranged on the encapsulation member CPL. A user may input information by pressing or touching a touch sensor included in the touch screen. The touch screen may include a plurality of sensing electrodes and sensing lines. The sensing lines may be connected to the sensing electrodes.

The light-blocking pattern BM may be arranged on the encapsulation member CPL, for example, in a region between the adjacent pixel regions PXA. The light-blocking pattern BM may reduce or prevent colors of light components emitted from the adjacent pixel regions PXA from being mixed with each other. Therefore, the light-blocking pattern BM may increase display characteristics of the display device.

Exemplary embodiments of the present invention have been disclosed herein, and although specific terms are employed, they are used and are to be interpreted in a generic and descriptive sense only and not for purpose of limitation. As would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate including a plurality of pixel regions and a non-pixel region, wherein the non-pixel region is arranged between adjacent pixel regions;
a first electrode arranged in each pixel region;
an organic light-emitting layer arranged on the first electrode;
a second electrode arranged on the organic light-emitting layer;
a phase matching layer arranged on the second electrode; and
at least one light-absorbing layer arranged on the phase matching layer,
wherein a thickness of the second electrode in the non-pixel region is different than a thickness of the second electrode in the pixel regions, and
wherein the second electrode is a semi-transmissive reflecting layer in the pixel regions and a reflecting layer in the non-pixel region.

2. The display device of claim 1, wherein the thickness of the second electrode in the non-pixel region is larger than the thickness of the second electrode in the pixel regions.

3. The display device of claim 2, wherein the thickness of the second electrode in the non-pixel region is larger than the thickness of the second electrode in the pixel regions by no less than 50 Å.

4. The display device of claim 2, wherein the thickness of the second electrode in the non-pixel region is about 200 Å to about 500 Å.

5. The display device of claim 2, wherein the thickness of the second electrode in the non-pixel region is about 4/3 to about 10/3 of the thickness of the second electrode in the pixel regions.

6. The display device of claim 1, wherein the light-absorbing layer in a visible ray region comprises a material in which multiplication of a refractive index and an extinction coefficient of the material is no less than 0.5.

7. The display device of claim 6, wherein the light-absorbing layer in the visible ray region comprises a material in which multiplication of a refractive index and an extinction coefficient of the material is about 2 to about 4.

8. The display device of claim 6, wherein the light-absorbing layer includes Cr, Mo, Ti, Co, Ni, Ti, Al, W, Mn, CrNx, TiNx, TiAlNx, MoOx, CuOx, or a combination thereof.

9. The display device of claim 1, wherein the phase matching layer in a visible ray region comprises a material with a refractive index of no less than 1 and an extinction coefficient of no more than 5.

10. The display device of claim 9, wherein the phase matching layer comprises SiNx, SiOx, SiCN, LiF, $MgF_2$, $CaF_2$, or any combination thereof.

11. The display device of claim 1, further comprising a thin film encapsulation layer arranged on the light-absorbing layer.

12. The display device of claim 11, further comprising a light-blocking pattern arranged on the thin film encapsulation layer in the non-pixel region.

13. The display device of claim 12, further comprising a touch screen arranged between the thin film encapsulation layer and the light-blocking pattern.

14. A display device, comprising:
a substrate including a plurality of pixel regions and a non-pixel region, wherein the non-pixel region is disposed between adjacent pixel regions;
a first electrode disposed in each pixel region;
an organic light-emitting layer disposed on the first electrode;
a second electrode disposed on the organic light-emitting layer; and
a reflection preventing layer disposed on the second electrode,
wherein a thickness of the second electrode in the non-pixel region is different than a thickness of the second electrode in the pixel regions, and wherein the second electrode is a reflecting layer in the non-pixel region.

15. The display device of claim 14, wherein the reflection preventing layer includes at least one phase matching layer disposed on the second electrode and at least one light-absorbing layer disposed on the at least one phase matching layer.

16. The display device of claim 15, wherein the light-absorbing layer in a visible ray region comprises a material in which multiplication of a refractive index and an extinction coefficient of the material is no less than 0.5.

17. The display device of claim 14, wherein the second electrode is a semi-transmissive reflecting layer in the pixel regions.

18. The display device of claim 14, further comprising an encapsulation member disposed on the reflection preventing layer.

19. A display device, comprising:
a substrate including a plurality of pixel regions and a non-pixel region, wherein the non-pixel region is arranged between adjacent pixel regions;
a first electrode arranged in each pixel region;
an organic light-emitting layer arranged on the first electrode;
a second electrode arranged on the organic light-emitting layer;
a phase matching layer arranged on the second electrode; and
at least one light-absorbing layer arranged on the phase matching layer,
wherein a thickness of the second electrode in the non-pixel region is different than a thickness of the second electrode in the pixel regions, and
wherein the second electrode is a reflecting layer in the non-pixel region.

20. The display device of claim 19, wherein the thickness of the second electrode in the non-pixel region is larger than the thickness of the second electrode in the pixel regions.

* * * * *